US012105424B2

(12) United States Patent
Bencher et al.

(10) Patent No.: US 12,105,424 B2
(45) Date of Patent: Oct. 1, 2024

(54) MULTI-TONE SCHEME FOR MASKLESS LITHOGRAPHY

(71) Applicant: Applied Materials, Inc., Santa Clara, CA (US)

(72) Inventors: Christopher Dennis Bencher, Santa Clara, CA (US); Thomas L. Laidig, Richmond, CA (US); Joseph R. Johnson, Redwood City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 155 days.

(21) Appl. No.: 17/639,240

(22) PCT Filed: Aug. 19, 2020

(86) PCT No.: PCT/US2020/046934
§ 371 (c)(1),
(2) Date: Feb. 28, 2022

(87) PCT Pub. No.: WO2021/041100
PCT Pub. Date: Mar. 4, 2021

(65) Prior Publication Data
US 2022/0326616 A1 Oct. 13, 2022

Related U.S. Application Data

(60) Provisional application No. 62/894,127, filed on Aug. 30, 2019.

(51) Int. Cl.
*G03F 7/20* (2006.01)
*G03F 7/00* (2006.01)

(52) U.S. Cl.
CPC ............ *G03F 7/2057* (2013.01); *G03F 7/203* (2013.01); *G03F 7/70625* (2013.01)

(58) Field of Classification Search
CPC ...... G03F 7/203; G03F 7/2051; G03F 7/2057; G03F 7/70383; G03F 7/70625; G03F 7/70191; G03F 7/70466; G02B 26/105
See application file for complete search history.

(56) References Cited

U.S. PATENT DOCUMENTS 4,924,257 A 5/1990 Jain
5,291,240 A 3/1994 Jain
(Continued)

FOREIGN PATENT DOCUMENTS

CN 1605046 A 4/2005
CN 1797203 A 7/2006
(Continued)

OTHER PUBLICATIONS

Chinese Office Action dated Oct. 12, 2023 for Application No. 202080069582.2.
(Continued)

*Primary Examiner* — Deoram Persaud
(74) *Attorney, Agent, or Firm* — Patterson + Sheridan, LLP

(57) ABSTRACT

Examples described herein provide a system, a software application, and a method of a lithography process to write multiple tones in a single pass. A system includes a stage and a lithography system. The lithography system includes image projection systems, a controller, and memory. The controller is coupled to the memory, which stores instruction code. Execution of the instruction code by the controller causes the controller to control the stage and the image projection systems to iteratively expose a photoresist supported by the stage and to move the stage relative to the image projection systems a step distance between sequential pairs of the exposures. Each exposure includes using write beam(s) projected from the image projection systems. Each exposure is at a respective one of different dosage amounts.

(Continued)

An accumulation of the different dosage amounts is a full tone dosage amount for the photoresist.

19 Claims, 10 Drawing Sheets

(56) References Cited

U.S. PATENT DOCUMENTS

| | | | |
|---|---|---|---|
| 6,175,122 B1* | 1/2001 | Groves | H01J 37/3177 |
| | | | 250/492.23 |
| 6,274,290 B1 | 8/2001 | Veneklasen et al. | |
| 6,333,138 B1 | 12/2001 | Higashikawa et al. | |
| 6,869,739 B1 | 3/2005 | Ausschnitt et al. | |
| 10,571,809 B1* | 2/2020 | Bencher | G03F 7/70508 |
| 2010/0099035 A1 | 4/2010 | Sandstrom et al. | |
| 2013/0003029 A1* | 1/2013 | Laidig | G03F 7/70291 |
| | | | 355/53 |
| 2013/0314682 A1* | 11/2013 | Kemmoku | G03G 15/043 |
| | | | 355/68 |
| 2014/0172386 A1 | 6/2014 | Belledent | |
| 2014/0191375 A1 | 7/2014 | Hartley et al. | |
| 2014/0192334 A1* | 7/2014 | Chen | G03F 7/704 |
| | | | 355/46 |
| 2015/0248993 A1* | 9/2015 | Reiter | H01J 37/3026 |
| | | | 250/492.22 |
| 2016/0033867 A1* | 2/2016 | Bencher | G03F 7/0037 |
| | | | 430/30 |
| 2016/0274465 A1* | 9/2016 | Lu | G03F 7/70033 |
| 2017/0003598 A1 | 1/2017 | Johnson et al. | |
| 2018/0149981 A1* | 5/2018 | Aben | G03F 7/707 |
| 2019/0025705 A1 | 1/2019 | Van Der Laan et al. | |
| 2019/0066976 A1 | 2/2019 | Platzgummer et al. | |
| 2019/0214226 A1* | 7/2019 | Platzgummer | H01J 37/3026 |
| 2019/0361361 A1* | 11/2019 | Nishimura | G03F 7/20 |
| 2022/0174246 A1* | 6/2022 | Bencher | G02B 26/0816 |

FOREIGN PATENT DOCUMENTS

| | | |
|---|---|---|
| CN | 101364050 A | 2/2009 |
| CN | 102656514 A | 9/2012 |
| CN | 106575604 A | 4/2017 |
| JP | 2000-260686 A | 9/2000 |
| JP | 2000310844 A | 11/2000 |
| KR | 10-2013-0008641 A | 1/2013 |
| KR | 10-2016-0132436 A | 11/2016 |
| KR | 10-2017-0038891 A | 4/2017 |

OTHER PUBLICATIONS

International Search Report and Written Opinion, PCT/US2020/046934, Mar. 4, 2021.

Chinese Office Action dated May 23, 2023 for Application No. 202080069582.2.

Korean Office Action dtd Feb. 1, 2024 for U.S. Appl. No. 17/639,240.

* cited by examiner

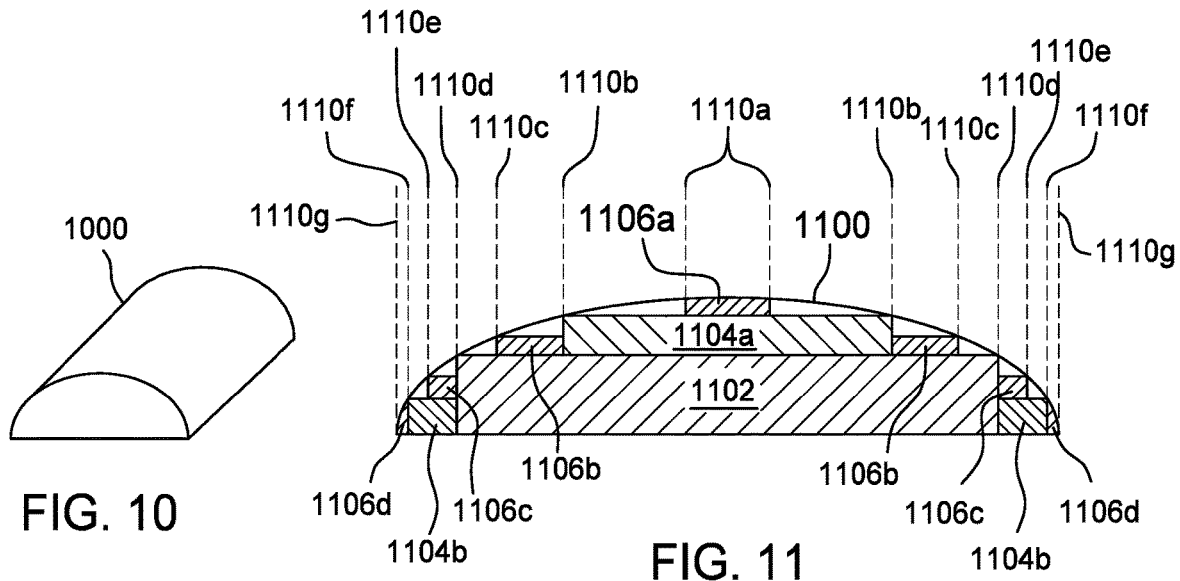
FIG. 10
FIG. 11
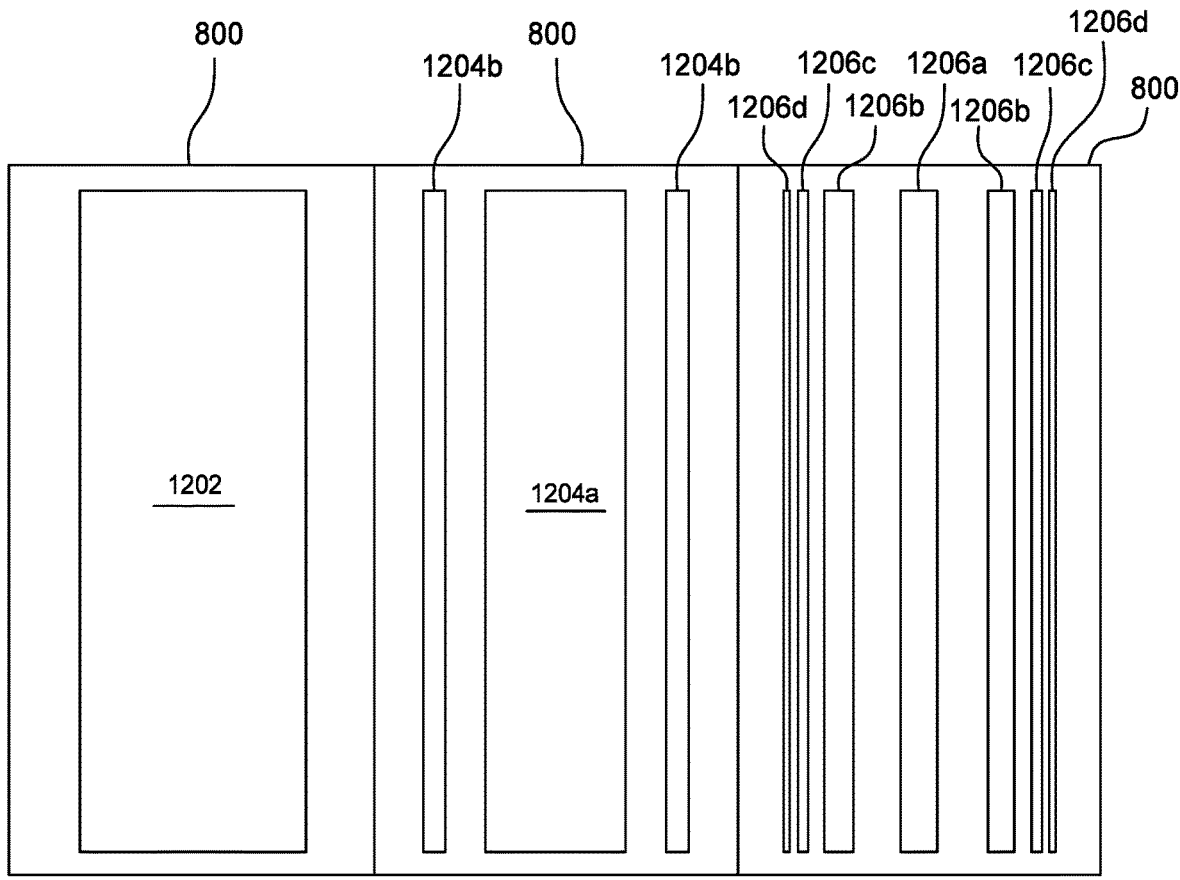
FIG. 12

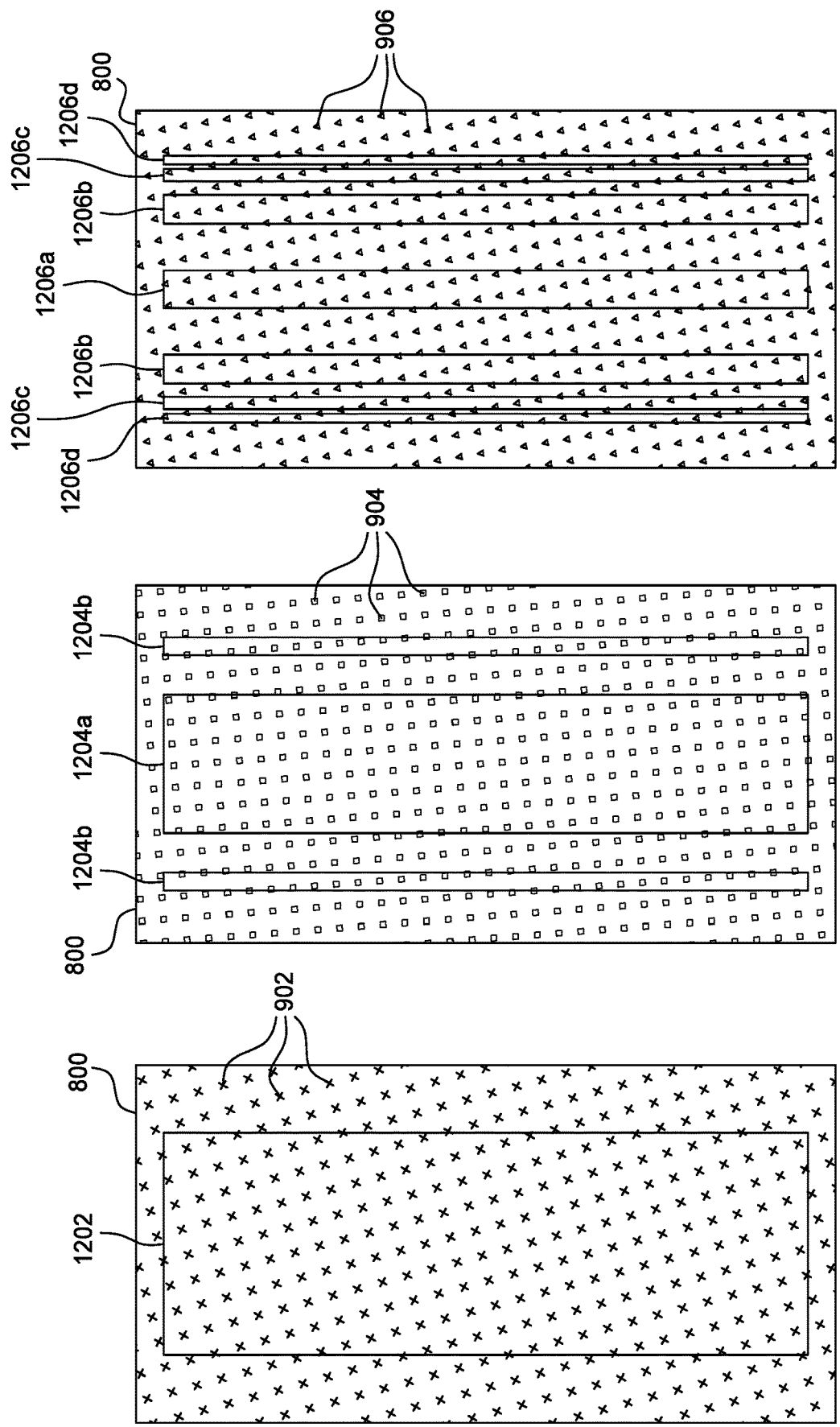

MULTI-TONE SCHEME FOR MASKLESS LITHOGRAPHY

BACKGROUND

Field

Examples of the present disclosure generally relate to lithography systems. More particularly, examples of the present disclosure relate to a system, a software application, and/or a method of a lithography process to expose multiple tones in a single pass.

Description of the Related Art

Photolithography is widely used in the manufacturing of semiconductor devices, such as for back-end processing of semiconductor devices, and display devices, such as liquid crystal displays (LCDs). For example, large area substrates are often utilized in the manufacture of LCDs. LCDs, or flat panel displays, are commonly used for active matrix displays, such as computers, touch panel devices, personal digital assistants (PDAs), cell phones, television monitors, and the like. Generally, flat panel displays include a layer of liquid crystal material as a phase change material at each pixel, sandwiched between two plates. When power from a power supply is applied across or through the liquid crystal material, an amount of light passing through the liquid crystal material is controlled, e.g., selectively modulated, at the pixel locations enabling images to be generated on the display.

With a conventional lithography system, multiple passes of the substrate under the writable area of the lithography system are required to write a pattern of full tone portions with a full tone dose, and grey tone portions with a grey tone dose into a photoresist disposed over a substrate. Multiple passes of the substrate under the writable area digital lithography system decrease throughput and can cause overlay problems.

SUMMARY

In some examples, a system is provided. The system includes a stage, a lithography system support, and a lithography system. The stage is configured to support a substrate having a photoresist disposed thereon. The lithography system includes image projection systems, a controller, and memory. The image projection systems are coupled to the lithography system support. The controller is coupled to the memory, and the memory stores instruction code to be executed by the controller. Execution of the instruction code by the controller causes the controller to control the stage and the image projection systems to iteratively expose the photoresist supported by the stage. The controller is further configured to move the stage relative to the image projection systems a step distance between sequential pairs of the exposures. Each of the exposures includes using one or more write beams projected from the image projection systems. Each of the exposures is at a respective one of different dosage amounts. An accumulated dosage amount that is an accumulation of the different dosage amounts is a full tone dosage amount for the photoresist.

In other examples, a non-transitory storage medium stores instructions. When the instructions are executed by a processor, the execution causes the processor to perform operations including generating a nominal address grid to be overlaid on a substrate surface to be processed by a lithography system. The processor generates a processing multiplicity by increasing a nominal multiplicity by a multiple of an integer number. The processor further generates the integer number of processing address grids based on the nominal address grid, and generates a recipe for processing by the lithography system based on the processing address grids and different dosage amounts. The lithography system includes image projection systems including an array of pixels. Each pixel of the array of pixels is configured to selectively direct a write beam towards the substrate surface. The processor is further configured to generate the nominal address grid is based on the nominal multiplicity and a nominal step distance for forming a full tone feature in a photoresist. Additionally, the processor generates the nominal address grid is further based on the array of pixels. Each of the processing address grids is associated with a respective one of the different dosage amounts. An accumulated dosage amount that is an accumulation of the different dosage amounts is a full tone dosage amount for forming the full tone feature.

In yet other examples, a method is provided. The method includes executing a recipe by a lithography system. Executing the recipe including, in a single scan: iteratively exposing a photoresist supported by a stage of the lithography system using image projection systems of the lithography system and moving the stage relative to the image projection systems a processing step distance after the exposure and before a subsequent exposure. The image projection systems has an array of pixels. Each pixel of the array of pixels is configured to selectively direct a write beam towards the photoresist. Each of the exposures is at a dosage amount different from an immediately preceding one of the exposures. For each of the exposures, one or more pixels of the array of pixels projects a respective write beam to the photoresist when a centroid of the respective pixel aligns with an address location of a processing address grid associated with the respective dosage amount of the respective exposure and when the address location is within a polygon associated with the respective dosage amount of the respective exposure. An accumulation of the dosage amounts being a full tone dosage amount for forming a full tone feature in the photoresist.

BRIEF DESCRIPTION OF THE DRAWINGS

So that the manner in which the above recited features of the present disclosure can be understood in detail, a more particular description of the disclosure, briefly summarized above, may be had by reference to described examples, some of which are illustrated in the appended drawings. It is to be noted, however, that the appended drawings illustrate only examples and are therefore not to be considered limiting of its scope, and may admit to other equally effective implementations.

FIG. 10 is a perspective view of a three-dimensional structure to be patterned in a photoresist according to some examples.

FIG. 11 is a dosage curve cross-section to realize the three-dimensional structure of FIG. 10 and intermediate layers according to some examples.

FIG. 12 depicts frame layers including frame polygon(s) overlaid on a substrate surface according to some examples.

FIGS. 15, 16, and 17 depict respective processing address grids and the frame polygon(s) of respective frame layers overlaid on the substrate surface according to some examples.

To facilitate understanding, identical reference numerals have been used, where possible, to designate identical elements that are common to the figures. It is contemplated that elements and features of one example may be beneficially incorporated in other examples without further recitation.

DETAILED DESCRIPTION

Examples described herein provide a system, a software application, and a method of a lithography process, such as a digital lithography process, to write multiple tones in a single pass. A recipe can be generated by generating a nominal address grid with a nominal multiplicity and nominal step distance and generating an integer number n of processing address grids based on the nominal address grid. The integer number n is the number of different dosage amounts, for example. Each processing address grid is associated with a respective dosage amount. A processing multiplicity is the integer n multiplied by the nominal multiplicity, and a processing step distance is the nominal step distance divided by the integer n. A three-dimensional structure to be patterned in a photoresist can be decomposed into frame layers, each having one or more frame polygons, where each frame layer is associated with a respective dosage amount. The recipe can be generated that, when executed, iteratively exposes a photoresist (e.g., on a substrate on a stage), where the iterative exposures of the photoresist cycle through different dosage amounts. Each exposure includes projecting write beams (e.g., "shots") from pixels of a pixel array of an image projection system to the photoresist when a centroid of the respective pixel aligns with an address location of the processing address grid associated with the dosage amount of the respective exposure and is within a frame polygon of a frame layer associated with the dosage amount of the respective exposure.

A recipe executed according to some examples described herein can realize convolution imaging in a photoresist. The convolution imaging can realize various three-dimensional structures in the photoresist, such as tapered and/or angled sidewalls, concave surfaces, convex surfaces, etc. The three-dimensional structures in the photoresist can be transferred into one or more underlying layers by an etch process (e.g., an anisotropic etch process), which can incorporate the three-dimensional structures in an integrated circuit, display, etc. The recipe can be executed in a single pass of a system (e.g., lithography system). Executing the recipe in a single pass can obviate multiple substrate loading and substrate alignments, which can avoid overlay errors when forming three-dimensional structure in a photoresist.

Various examples are described below. Although multiple features of different examples may be described together in a process flow or system, the multiple features can each be implemented separately or individually and/or in a different process flow or different system. Additionally, various process flows or operations are described as being performed in an order; other examples can implement process flows or operations in different orders and/or with more or fewer operations.

Figure 1:
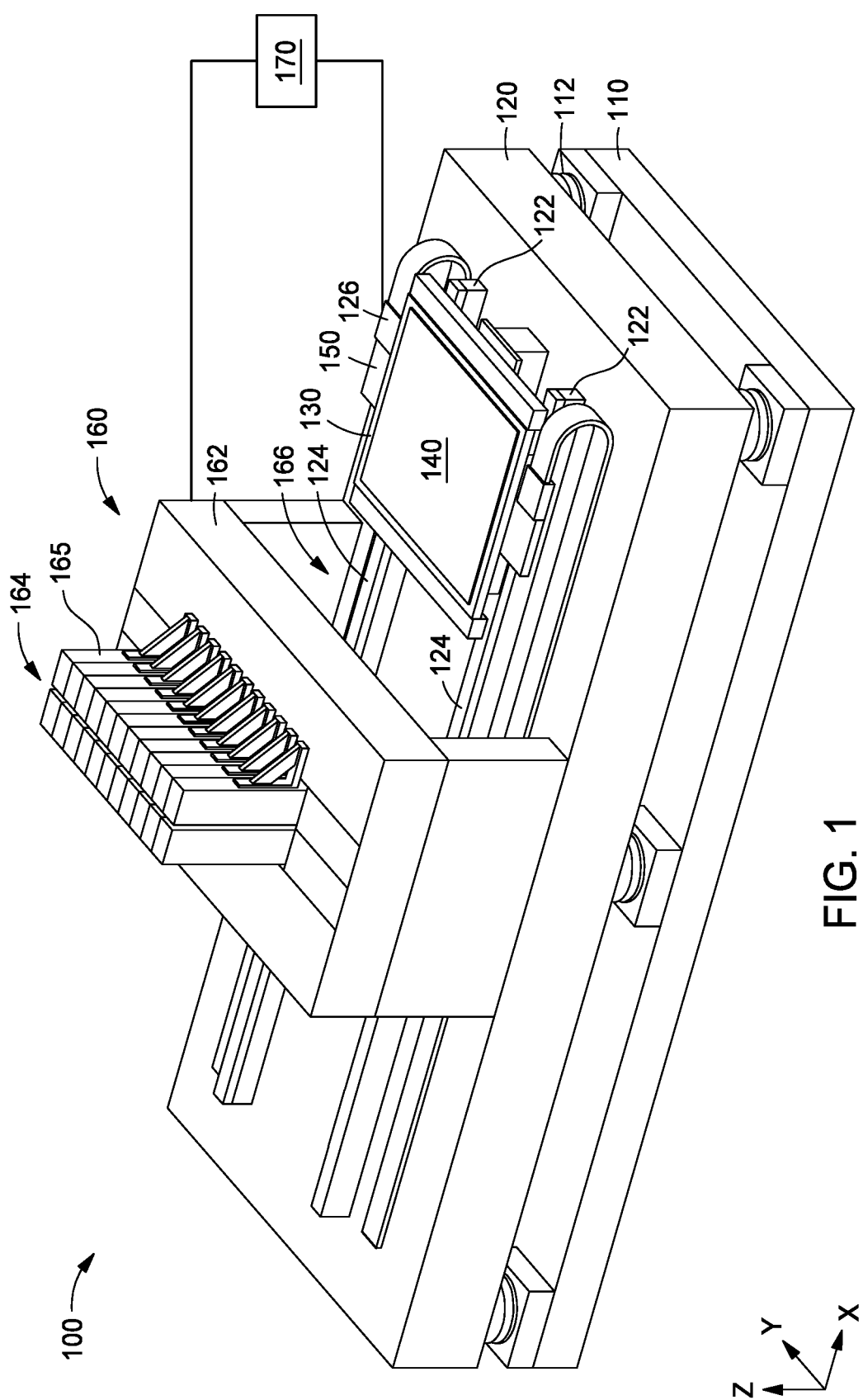
FIG. 1 is a perspective view of a system, such as a digital lithography system, that may be implemented in some examples.

FIG. 1 is a perspective view of a system 100, such as a digital lithography system, that may be implemented in some examples. The system 100 includes a base frame 110, a slab 120, a stage 130, and a processing apparatus 160. The base frame 110 may rest on the floor of a fabrication facility and may support the slab 120. Passive air isolators 112 may be positioned between the base frame 110 and the slab 120 and may further support the slab 120. The slab 120 may be a monolithic piece of granite, for example.

The stage 130 is disposed on the slab 120. The stage 130 is supported on the slab 120 by a pair of supports 122 and a pair of tracks 124. The pair of supports 122 are disposed on the slab 120. In some examples, the slab 120 and the pair of supports 122 may be a single piece of material. The pair of tracks 124 is supported by the pair of the supports 122, and the stage 130 may move along the tracks 124 in the X-direction as indicated by the coordinate system shown in FIG. 1. In some examples, the pair of tracks 124 is a pair of parallel magnetic channels. As shown, each track of the pair of tracks 124 is a straight line path. In other examples, each track of the pair of tracks 124 may have a non-straight line path.

The stage 130 is configured to support a substrate 140. Holes (not shown) may be formed in the stage 130 for allowing lift pins (not shown) to extend therethrough. The lift pins may rise to an extended position to receive the substrate 140, such as from a transfer robot (not shown). The transfer robot may position the substrate 140 on the lift pins, and the lift pins may thereafter lower the substrate 140 onto the stage 130.

The substrate 140 includes any suitable material and may, for example, be made of quartz, glass, or any other material, which may be used as part of a flat panel display. In some examples, the substrate 140 may have a photoresist layer formed thereon. The photoresist layer on the substrate 140 can be patterned using the system 100. A photoresist is sensitive to electromagnetic radiation, for example blue light, near ultraviolet (UV) light, UV light, or deep UV light. The photoresist may be a positive photoresist or a negative photoresist. A positive photoresist, when exposed to electromagnetic radiation, is soluble to a photoresist developer applied to the photoresist after the exposure to the electromagnetic radiation. A negative photoresist, when exposed to electromagnetic radiation, is insoluble to a photoresist developer applied to the photoresist after the exposure to the electromagnetic radiation. The chemical composition of the photoresist determines whether the photoresist is a positive photoresist or negative photoresist. Example photoresists include diazonaphthoquinone, a phenol formaldehyde resin, poly(methyl methacrylate), poly(methyl glutarimide), and SU-8. A pattern formed in a photoresist (as a result of exposing the photoresist to electromagnetic radiation and developing by a photoresist developer) may be used to form circuitry on the substrate 140. For example, after exposing and developing the photoresist, the photoresist can be used as a mask for etching an underlying thin film to form various structures in the underlying film layer.

The processing apparatus 160 includes a support 162 and a processing unit 164. The support 162 is disposed on the slab 120 and has an opening 166 therethrough for the stage 130 to pass under the processing unit 164. The processing unit 164 is coupled to and supported by the support 162. In some examples, the processing unit 164 is a pattern generator configured to expose a photoresist on the substrate 140 in a photolithography process. In some examples, the pattern generator may be configured to perform a maskless lithography process. The processing unit 164 may include image projection systems disposed in a case 165. The processing apparatus 160 may be utilized to perform maskless direct patterning. During operation, the stage 130 can move in the X-direction from a loading position, as shown in FIG. 1, to a processing position. The processing position may refer to one or more positions of the stage 130 as the stage 130 passes (e.g., is stepped or moved) under the processing unit 164. The stage 130 may also move in the Y-direction by moving along a track 150 for processing and/or indexing the substrate 140.

A controller 170 is generally configured to facilitate control and automation of processing techniques described herein. The controller 170 can include and/or be communicatively coupled to non-transitory memory. Instruction code representing a recipe for the control and automation of processing techniques implemented by the system 100 can be stored in the memory. The controller 170 can execute the instruction code stored in the memory to implement the recipe for the control and automation of processing techniques by the system 100. The controller 170 is coupled to an encoder 126 that is on or coupled to the stage 130. The encoder 126 can provide location information of the stage 130 to the controller 170. The controller 170 is also coupled to or in communication with the processing apparatus 160. The processing apparatus 160 and the encoder 118 may provide information to the controller 170 regarding the substrate processing and the substrate alignment. The controller 170 can initiate various exposures, as described in further detailed below, by the processing apparatus 160. The controller 170 facilitates the control and automation of methods of a lithography process to write multiple tones in a single pass.

Figure 2:
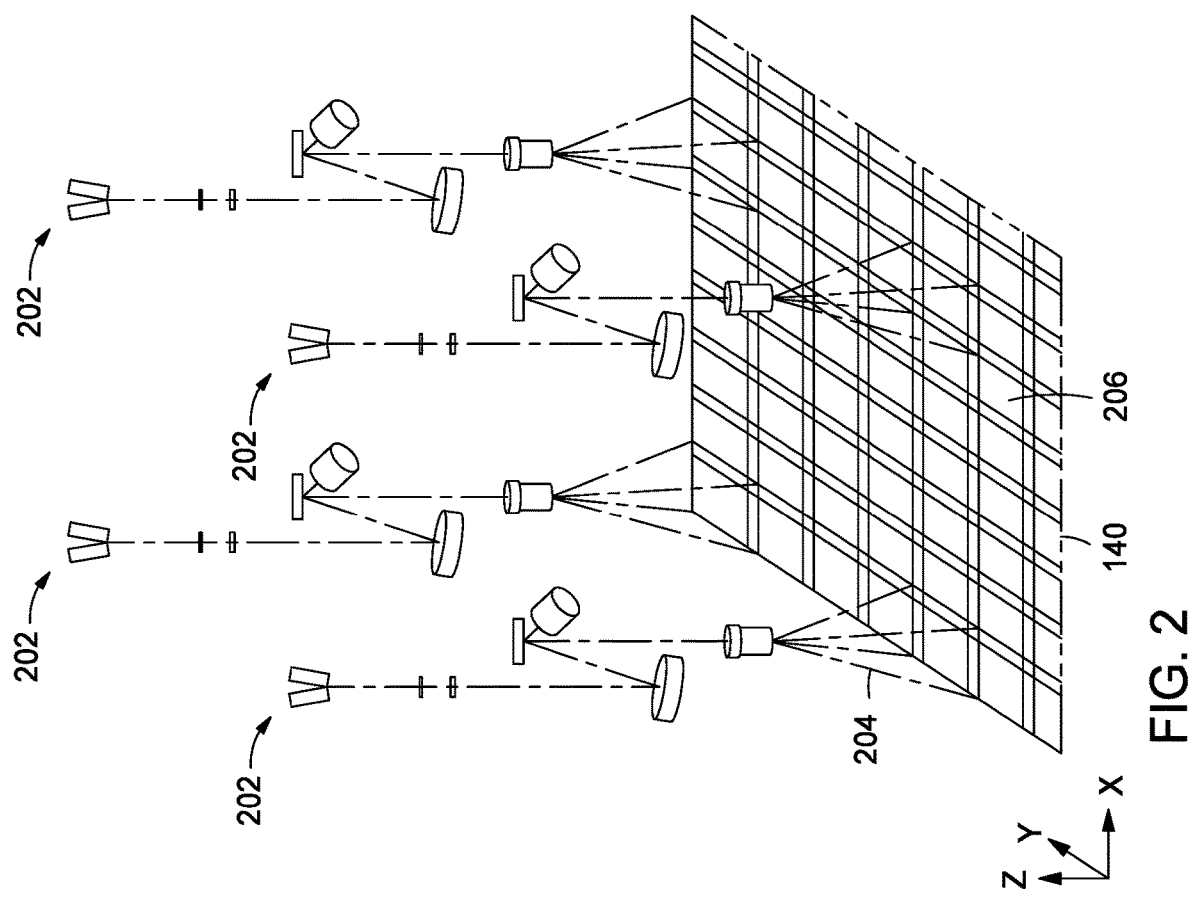
FIG. 2 is a simplified, perspective schematic view of image projection systems according to some examples.

FIG. 2 is a simplified, perspective schematic view of image projection systems 202 according to some examples. As shown in FIG. 2, each image projection system 202 is capable of producing and projecting write beams 204 to a surface 206 of the substrate 140. As the substrate 140 moves in the X-direction and/or Y-direction, the entire surface 206 may be patterned by the write beams 204.

Each image projection system 202 includes an array of spatial light modulators. Each spatial light modulator is referred to as a pixel, and hence, each image projection system 202 includes an array of spatial light modulator pixels. The array of spatial light modulator pixels include, but are not limited to, digital micromirrors, liquid crystal displays (LCDs), liquid crystal over silicon (LCoS) devices, ferroelectric liquid crystal on silicon (FLCoS) devices, and microshutters. Each spatial light modulator pixel is individually controllable and is configured to project a write beam. The number of the image projection systems 202 may vary based on the size of the substrate 140 and/or the speed of stage 130. In some examples, there are twenty-two (22) image projection systems 202 in the processing apparatus 160.

Figure 3:
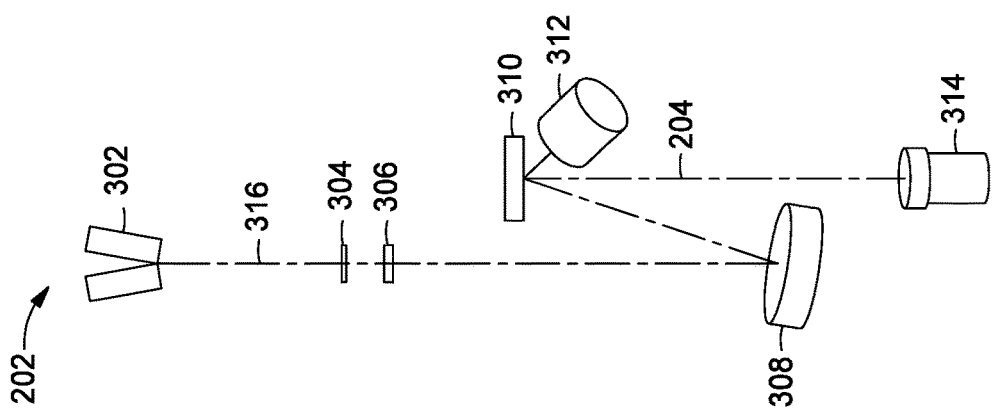
FIG. 3 is a simplified, perspective schematic view of an image projection system of FIG. 2 according to some examples.

FIG. 3 is a simplified, perspective schematic view of an image projection system 202 of FIG. 2 according to some examples. The illustrated image projection system 202 includes a light source 302, an aperture 304, a lens 306, a frustrated prism assembly or mirror 308, a spatial light modulator pixel 310, a light dump 312, and a projection lens 314. In other examples, an image projection system may include different or fewer components than illustrated.

The light source 302 may be a light emitting diode (LED) or a laser, and the light source 302 may be capable of producing a light having a predetermined wavelength. In some examples, the predetermined wavelength is in the blue or near ultraviolet (UV) range, such as less than about 450 nm. The frustrated prism assembly or mirror 308 may be configured to focus a beam 316 generated by the light source 302, and passed through the aperture 304 and lens 306, onto the spatial light modulator pixel 310. The projection lens 314 may be a 10× objective lens.

The controller 170 is operable to individually control the spatial light modulator pixels 310 of the image projection systems 202 based on the instruction code representing the recipe. In operation, based on control by the controller 170, each spatial light modulator pixel 310 is at an "on" position or "off" position. During operation, the beam 316 is produced by the light source 302 and is directed to the frustrated prism assembly or mirror 308. The beam 316 is directed from and focused by the frustrated prism assembly or mirror 308 to spatial light modulator pixels 310 of the image projection system 202. When the beam 316 reaches the spatial light modulator pixels 310, the spatial light modulator pixels 310 in an "on" position reflect the beam 316, e.g., forming the write beams 204, to the projection lens 314. The projection lens 314 then projects the write beam 204 to the surface 206 of the substrate 140. As used herein, a write beam 204 is also referred to as a "shot." The spatial light modulator pixels 310 that are at an "off" position reflect the beam 316 to the light dump 312 instead of the surface 206 of the substrate 140.

In some examples, an image projection system 202 is a digital micromirrors device (DMD) that includes mirrors, which are the spatial light modulator pixels 310. In some examples, the DMD includes 1920×1080 mirrors, which represent the number of pixels of a high definition television or other flat panel displays. In some examples, the DMD includes more than about 4,000,000 mirrors.

Figure 4:
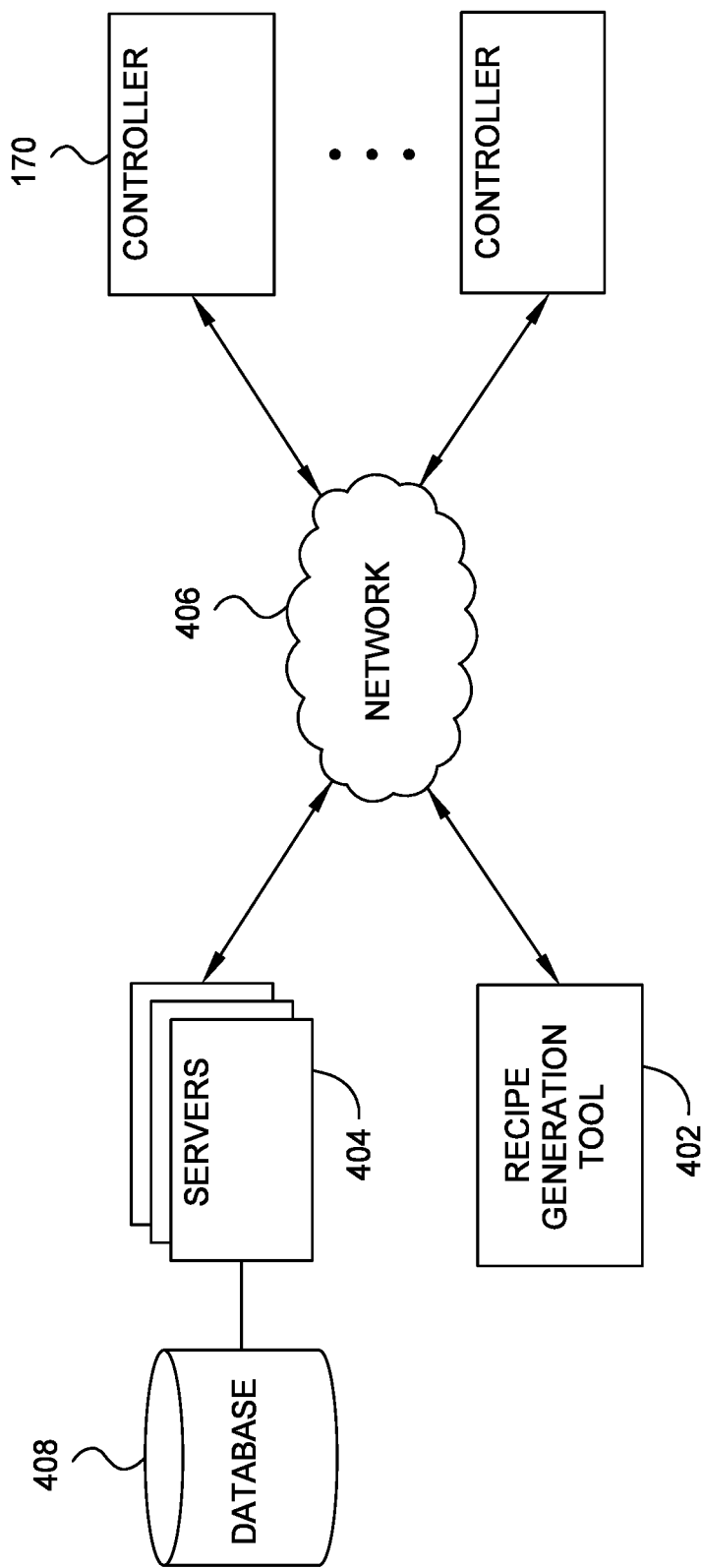
FIG. 4 is a schematic view of interconnected devices configured for generating and executing a recipe by a system according to some examples.

FIG. 4 is a schematic view of interconnected devices configured for generating and executing a recipe by the system 100. As shown in FIG. 4, the interconnected devices may include controllers 170, a recipe generation tool 402, and servers 404, each connected to a communications network 406 (for example, an intranet and/or the Internet). Examples of the recipe generation tool 402 and the controller 170 are illustrated in and described below with respect to FIGS. 5 and 6, respectively. Each server 404 may include a processor and a system memory (not shown), and may be configured to manage content stored in the database 408 using, for example, relational database software and/or a file system. The servers 404 may communicate with the database 408 via a local connection (for example, a Storage Area Network (SAN) or Network Attached Storage (NAS)) or via the communications network 406. The servers 404 are configured to either directly access data included in the database 408 or to interface with a database manager that is configured to manage data included within the database 408. The servers 404, the recipe generation tool 402, and the controllers 170 can communicate with each other via the communications network 406, such as by using a network protocol such as, for example, the TCP/IP protocol.

Figure 5:
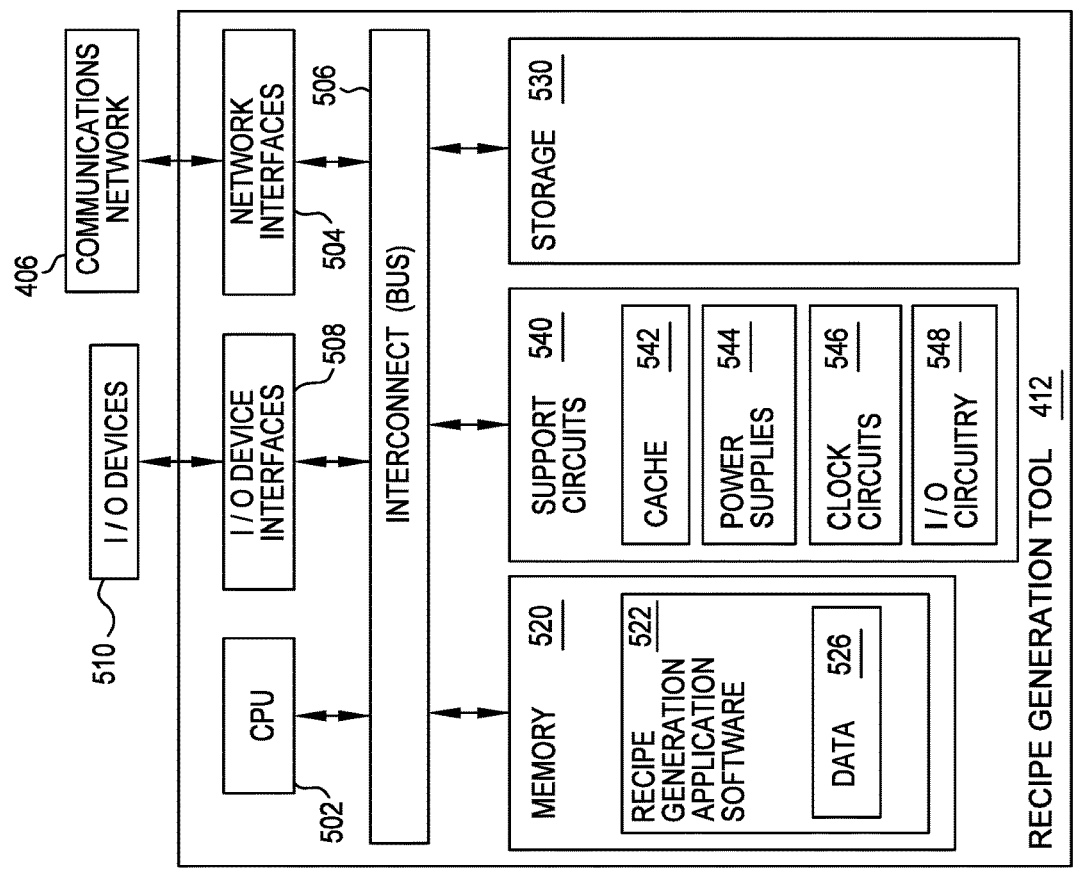
FIG. 5 is a schematic view of the recipe generation tool according to some examples.

FIG. 5 is a schematic view of the recipe generation tool 402 according to some examples. The recipe generation tool 402 includes a central processing unit (CPU) 502, a network interface 504, memory 520, storage 530, and support circuits 540, each connected to an interconnect 506. The recipe generation tool 402 may also include I/O device interface(s) 508 connecting I/O devices 510 (for example, keyboard, display, touchscreen, and mouse devices) to the recipe generation tool 402. The network interface 504 can be connected to, e.g., the communications network 406 and can be configured to transmit data via the communications network 406.

The CPU 502 is configured to retrieve and execute instruction code stored in the memory 520 and/or storage 530 and is generally configured to control and coordinate operations of other system components. Similarly, the CPU 502 is configured to cause application data 526 to be stored in the memory 520 and to retrieve application data stored in the memory 520. The CPU 502 is included to be representative of a single CPU, multiple CPUs, a single CPU having multiple processing cores, etc. The interconnect 506 is operable to transmit instruction code and application data 526 between the CPU 502, I/O device interfaces 508, storage 530, network interfaces 504, and memory 520.

The memory 520 is generally included to be representative of any non-transitory memory (e.g., random access memory (RAM) (like static RAM and dynamic RAM), read-only memory (ROM), etc.), which may be volatile and/or non-volatile, and, in operation, is operable to store one or more software applications and data for use by the CPU 502. Storage 530 is generally included to be representative of any non-transitory, non-volatile memory, such as a hard disk drive, solid-state storage drive (SSD), etc. Although shown as a single unit, the storage 530 may be a combination of fixed and/or removable storage devices, such as fixed disk drives, floppy disk drives, hard disk drives, flash memory storage drives, tape drives, removable memory cards, CD-ROM, optical storage, etc. configured to store non-volatile data. The memory 520 may store instruction code for recipe generation application software 522 that is capable of being executed by the CPU 502. In some examples, the instruction code for recipe generation application software 522 may additionally and/or alternatively be stored in the storage 530.

The support circuits 540 are also connected to the interconnect 506 for supporting the CPU 502 and/or are connected to other components for support thereof. The support circuits 540 may include cache 542, power supplies 544, clock circuits 546, input/output circuitry 548, and the like.

Figure 6:
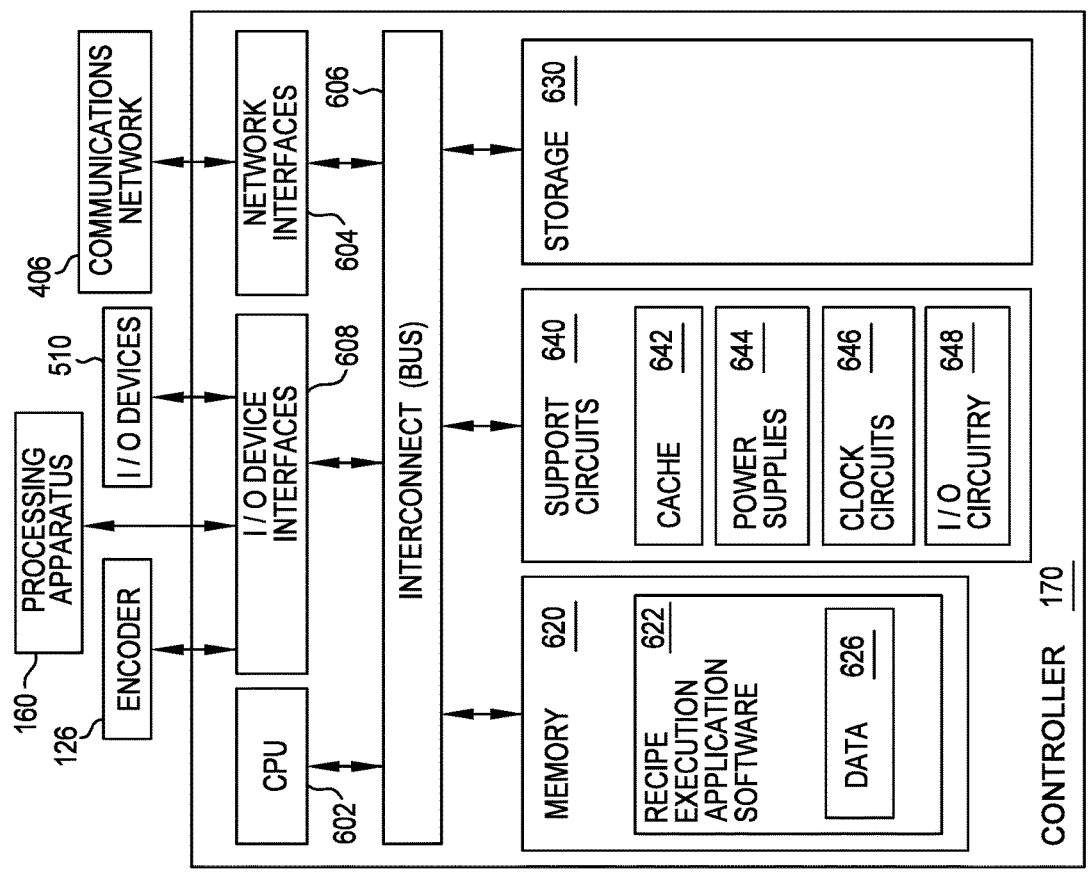
FIG. 6 is a schematic view of a controller according to some examples.

FIG. 6 is a schematic view of a controller 170 according to some examples. The controller 170 includes a CPU 602, a network interface 604, an interconnect 606, I/O device interfaces 608, memory 620, storage 630, and support circuits 640, each connected to the interconnect 606. The I/O device interfaces 608 are connected to I/O devices 610 (for example, keyboard, display, touchscreen, and mouse devices), the processing apparatus 160, and the encoder 126. The network interface 604 can be connected to, e.g., the communications network 406 and can be configured to transmit data via the communications network 406.

The CPU 602 is configured to retrieve and execute instruction code stored in the memory 620 and/or storage 630 and is generally configured to control and coordinate operations of other system components. Similarly, the CPU 602 is configured to cause application data 626 to be stored in the memory 620 and to retrieve application data stored in the memory 620. The CPU 602 may be one of any form of computer processors that are used in industrial settings for controlling various processes and hardware (e.g., pattern generators, motors, and other hardware) and monitor the processes (e.g., processing time and substrate position). Instruction code executable by the controller 170 can determine which tasks are performable on the substrate 140. For example, the CPU 602 can control the processing apparatus 160 via communications via the interconnect 606 and I/O device interfaces 608 and/or may receive data from the encoder 126 via communications via the interconnect 606 and I/O device interfaces 608. The CPU 602 is included to be representative of a single CPU, multiple CPUs, a single CPU having multiple processing cores, etc. The interconnect 606 is operable to transmit instruction code and application data 626 between the CPU 602, I/O device interfaces 608, storage 630, network interfaces 604, and memory 620.

The memory 620 is generally included to be representative of any non-transitory memory, which may be volatile and/or non-volatile, and, in operation, is operable to store one or more software applications and data for use by the CPU 602. Storage 630 is generally included to be representative of any non-transitory, non-volatile memory, like storage 530. The memory 620 may store instruction code for recipe execution application software 622 that is capable of being executed by the CPU 602. In some examples, the instruction code for recipe execution application software 622 may additionally and/or alternatively be stored in the storage 630.

The support circuits 640 are also connected to the interconnect 606 for supporting the CPU 602 and/or are connected to other components for support thereof. The support circuits 640 may include cache 642, power supplies 644, clock circuits 646, input/output circuitry 648, and the like.

Some examples distribute aspects described herein among the various devices of FIG. 4. For example, data relating to a system 100 (e.g., an angle of rotation of an image projection system as described below) can be measured and/or obtained by the controller 170, which can communicate the data to the server 404 for storage in the database 408. The recipe generation tool 402 can retrieve the data from the database 408 via the server(s) 404 for generating a recipe to be implemented by the controller 170 on the system 100. The recipe generation tool 402 can generate a recipe and communicate the recipe to the server 404 for storage in the database 408, which can be retrieved by the controller 170, or can communicate the recipe to the controller 170. The controller 170 can then execute the recipe at the system 100. In some examples, recipe generation and execution can be performed by the controller 170. Various different combinations and permutations of distribution of different aspects described herein will be readily apparent to a person having ordinary skill in the art, and different examples contemplate these combinations and permutations.

Figure 7A:
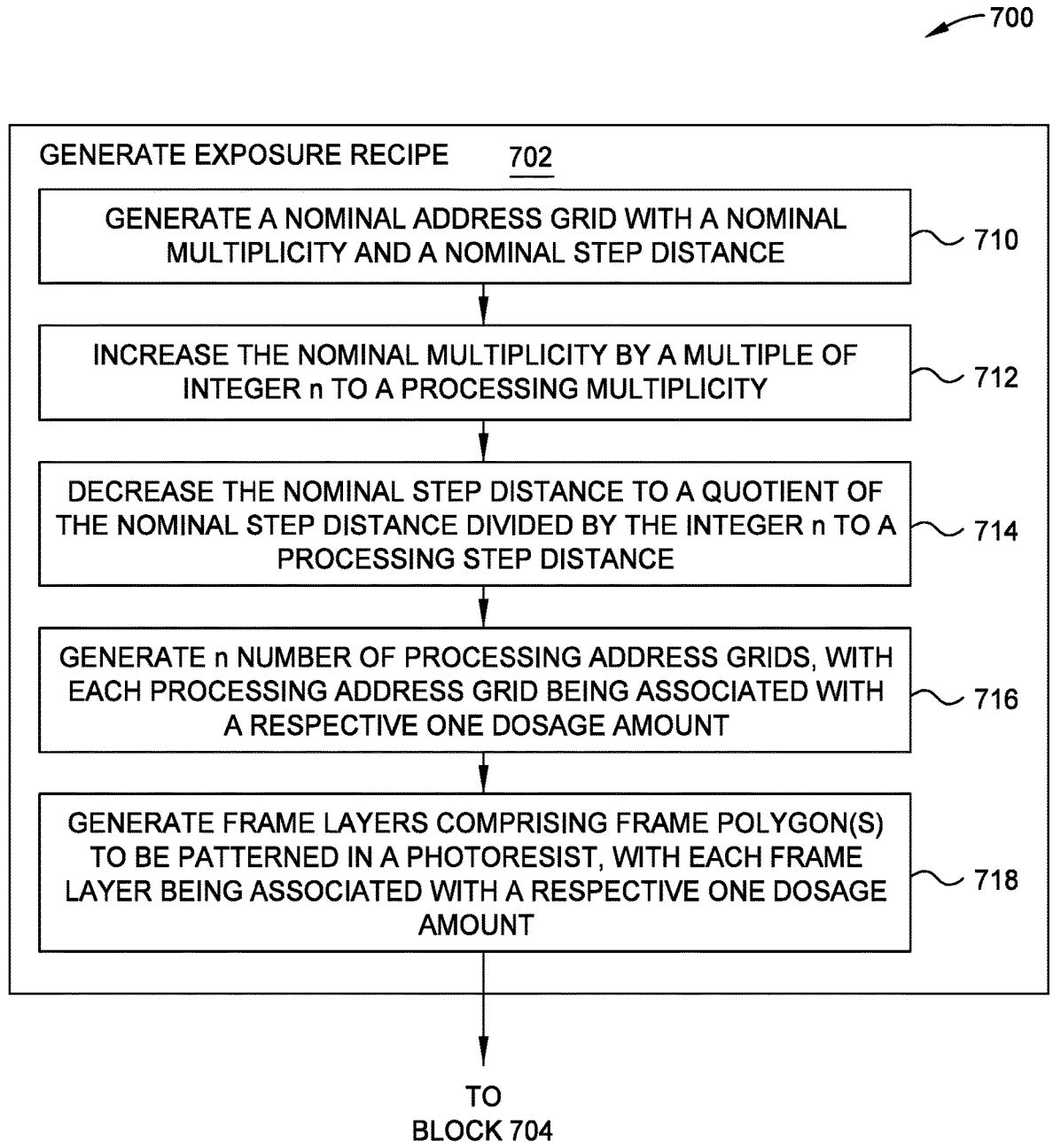
FIGS. 7A and 7B are a flow diagram of a method for generating and executing a recipe of a lithography process according to some examples.
Figure 7B:
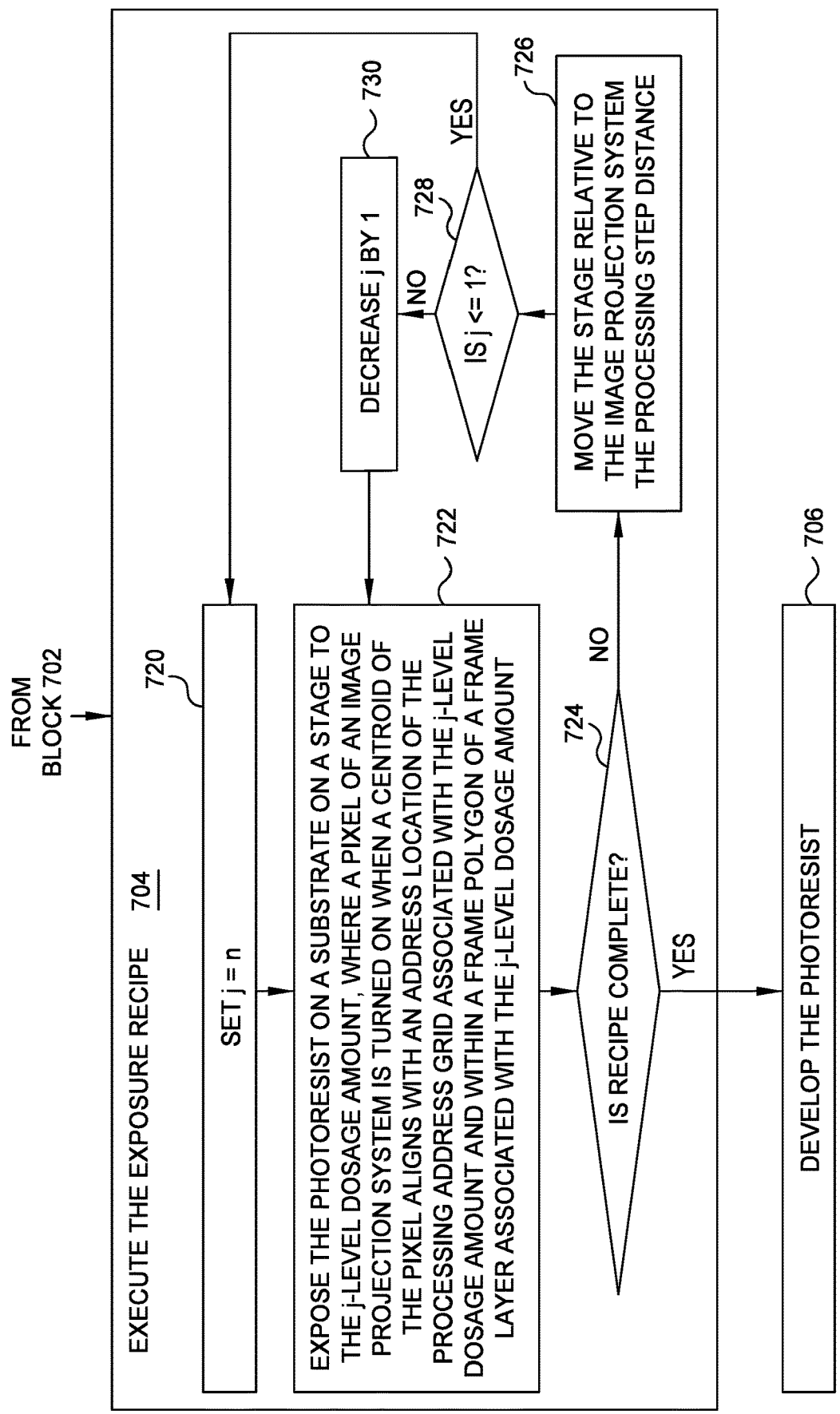

FIGS. 7A and 7B are a flow diagram of a method 700 for generating and executing a recipe of a lithography process according to some examples. At block 702, an exposure recipe is generated. At block 704, the exposure recipe is executed. At block 706, a photoresist (which was subject to processing according to the exposure recipe) is developed. In some examples, the exposure recipe generated at block 704 is performed by a recipe generation tool 402, such as by executing a recipe generation application software 522. As an example, the recipe generation application software 522 can include computer-aided design (CAD) software that allows a user to create, via I/O devices 510, a representation of a three-dimensional photoresist pattern that is to be implemented by a system 100. The CAD software can render frame polygons of frame layers as described below. The recipe generation application software 522 can further generate address grids and can generate a recipe based on the frame layers and address grids as described below. In other examples, these different operations are distributed to different tools executing various application software. The controller 170 can execute the recipe on the system 100, such as by controlling the image projection systems and stage 130. The recipe can be executed to effectuate the various operations illustrated in block 704 and described further below.

In the illustrated example, generating the exposure recipe of block 702 includes blocks 710-718. At block 710, a nominal address grid is generated with a nominal multiplicity and a nominal step distance. The nominal address grid can further be generated based on a pixel array of spatial light modulators of an image projection system(s), an angle of rotation of the image projection system(s), and a number of dummy columns and/or rows of the pixel array of the image projection system(s). The image projection system(s) can be installed on the support 162 such that the pixel array of spatial light modulators is rotated by an angle of rotation relative to the stepping or scanning of a substrate 140 in the Y-direction as illustrated in FIG. 1. The dummy columns and/or rows can be based on the angle of rotation. The dummy columns and/or rows can be identified to avoid interference by exposures. The dummy columns and/or rows can be turned off during processing.

The nominal multiplicity and nominal step distance can be based on considerations such as line edge roughness (LER) and throughput. The nominal multiplicity can refer to the number of shots to populate a full tone feature in a photoresist. A higher multiplicity can increase precision and decrease LER with the tradeoff of increased processing time and lower throughput. The nominal step distance can refer to the distance that the stage 130 moves the substrate 140 between nominal exposures and can be tightly coupled to the pixel array and the nominal multiplicity. Generally, the nominal step distance is a quotient of (i) the difference between the number of columns of the pixel array (e.g., extending substantially perpendicularly from the Y-direction of FIG. 1) and the number of dummy columns divided by (ii) the nominal multiplicity.

Figure 8:
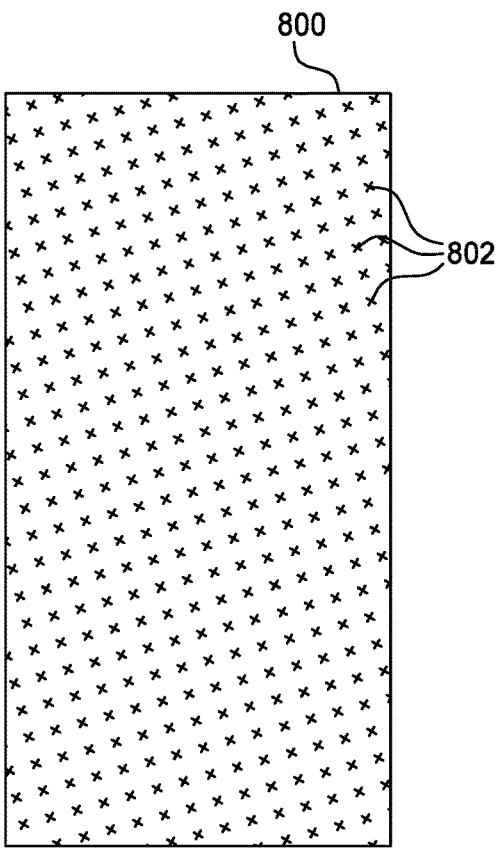
FIG. 8 is a nominal address grid overlaid on a substrate surface according to some examples.

The nominal address grid can be formed as a collection of address locations overlaid on a substrate surface. Each address location corresponds to a centroid where a pixel of the pixel array is capable of directing a write beam to the substrate surface (e.g., which does not include pixels in dummy columns and/or rows) for a position of the pixel array at a given position of the substrate. The collection of address locations includes each centroid for each position of the pixel array (e.g., each position after a movement triggers an exposure in a single scan). With the nominal step distance and angle of rotation, the nominal address grid can be a hexagonal close-packed (HCP) pattern. FIG. 8 illustrates a nominal address grid 802 overlaid on a substrate surface 800 as an example.

Referring back to the method 700 of FIGS. 7A and 7B, at block 712, the nominal multiplicity is increased by a multiple of integer n to a processing multiplicity. The integer n can permit n number of dosage amounts for shots. The levels of dosage amounts (e.g., described individually as a j-level dosage amount herein) can be different, which can permit greyscale exposure. As an example, n can equal three, and the dosage amounts can be some binary exponential multiple of a nominal dosage amount $d_0$. In such an example, each dosage amount could be $(2^{(j-1)})d_0$, where j corresponds to a level of a dosage amount and is in a range from 1 to n. Further, in that example, eight different accumulations of dosage amounts can result for any polygon to be written to a photoresist (e.g., no exposure, $d_0$ exposure, ... $7d_0$ exposure). Any integer n equal to or greater than two can be implemented. In some examples, the integer n can result in four or more quantized levels of exposure being available for any polygon to be written to a photoresist. The accumulated dosage amount of all of the levels of dosage amounts is equal to a dosage amount for forming a full tone feature in the photoresist (e.g., $D_{FT}=\Sigma_{j=1}^{n}d_j$, where $D_{FT}$ is the full tone dosage amount, and $d_j$ is a j-level dosage amount).

At block 714, the nominal step distance is decreased to a processing step distance. The processing step distance is a quotient of the nominal step distance divided by the integer n. Increasing the nominal multiplicity by a multiple of integer n results in the nominal step distance being decreased. As an example, if the nominal multiplicity and nominal step distance are 115 and 17.27 μm and n is three, the processing multiplicity is increased to 445, and the processing step distance is decreased to 5.76 μm.

Figure 9:
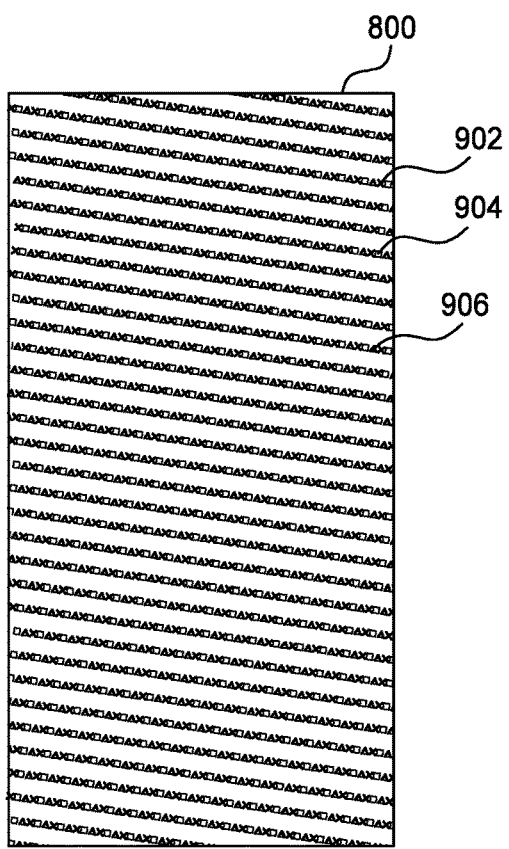
FIG. 9 depicts three processing address grids overlaid on a substrate surface according to some examples.

At block 716, n number of processing address grids are generated. Each processing address grid is associated with a respective one of the dosage amounts. With the angle of rotation and the identified dummy rows or columns, the processing address grids can be generated based on the nominal address grid and using the processing multiplicity and processing step distance. In some examples, a processing address grid associated with a level of a dosage amount can be superimposed on a processing address grid associated with another level of a dosage amount. In some examples, a processing address grid associated with a level of a dosage amount can be offset from a processing address grid associated with another level of a dosage amount, e.g., by some multiple of the processing step distance. Continuing the above example where n is equal to three (3), FIG. 9 illustrates three processing address grids 902, 904, 906 overlaid on a substrate surface 800. Processing address grid 902 corresponds to the nominal address grid 802 shown in FIG. 8. For the purposes of illustration herein, processing address grid 902 is associated with a j=3 level dosage amount (e.g., $4d_0$ exposure). Processing address grid 904 is associated with a j=2 level dosage amount (e.g., $2d_0$ exposure). Processing address grid 906 is associated with a j=1 level dosage amount (e.g., $d_0$ exposure). The processing address grid 904 and processing address grid 906 are offset, in this example, from the processing address grid 902 by the processing step distance and two times the processing step distance, respectively. Any processing address grid can be associated with any level of a dosage amount.

At block 718, frame layers include one or more polygons to be patterned in a photoresist are generated, and each frame layer is associated with a respective one of the dosage amounts. A representation of a three-dimensional structure (e.g., a CAD drawing) to be patterned in the photoresist can be decomposed into frame polygons that are rasterized. Generally, a dosage curve can be generated based on the representation of the three-dimensional structure to be patterned in the photoresist. The frame polygons can then be generated from the dosage curve. The levels of the rasterization can be quantized based on the different levels of the dosage amounts.

In some examples, intermediate layers, each associated with a respective level of a dosage amount, are generated from a dosage curve based on the respective level of the dosage amounts, and the intermediate layers are rasterized to form frame layers having polygons. The intermediate layers can be generated iteratively beginning with the intermediate layer associated with the highest level of the dosage amounts and continuing at each iteration to each next highest level of the dosage amounts. Each intermediate layer includes pixel(s) that have been identified to be associated with that intermediate layer. At each iteration and for the respective intermediate layer, pixel(s) are identified to be associated with that intermediate layer when the respective pixel is at a location where a difference between the dosage curve and an accumulation of dosage amounts of levels of previous iterations (if any) at that location is greater than or equal to the dosage amount associated with the intermediate layer. Each intermediate layer is then rasterized into a respective frame layer where contiguous pixels that have been identified as associated with that intermediate layer form respective frame polygon(s) within the frame layer. Pixel(s) within a frame polygon are set to on for the exposure of the associated dosage amount while other pixels are set to off.

FIG. 10 illustrates a perspective view of an exemplary three-dimensional structure 1000 to be patterned in a photoresist. The three-dimensional structure 1000 is a semi-elliptic cylinder in this example.

FIG. 11 illustrates a cross-section of the dosage curve 1100 to realize the three-dimensional structure 1000 and example intermediate layers. The cross-section of the dosage curve 1100 of FIG. 11 closely approximates a cross-section of the three-dimensional structure 1000 of FIG. 10, e.g., to more easily conceptualize the relation between the accumulation of dosage amounts and the three-dimensional structure 1000. In practice, a dosage curve cross-section can vary from the corresponding cross-section of a three-dimensional structure, e.g., due to a non-linear relationship between a dosage amount and a structure that is developed resulting from exposure to the dosage amount.

In FIG. 11, a j=3 intermediate layer includes pixels 1102 and is defined associated with a j=3 level dosage amount (e.g., $4d_0$). Pixels 1102 under the dosage curve 1100 between boundaries 1110d correspond to where the dosage curve 1100 is greater than or equal to the j=3 level dosage amount (e.g., $4d_0$) and are identified as associated with the j=3 intermediate layer.

A j=2 intermediate layer includes pixels 1104a, 1104b and is defined associated with a j=2 level dosage amount (e.g., $2d_0$). Pixels 1104a under the dosage curve 1100 between boundaries 1110b correspond to where the difference between the dosage curve 1100 and the j=3 level dosage amount (e.g., $4d_0$) is greater than or equal to the j=2 level dosage amount (e.g., $2d_0$) and are identified as associated with the j=2 intermediate layer. Pixels 1104b under the dosage curve 1100 between boundary 1110d and boundary 1110f correspond to where the dosage curve 1100 (e.g., where no j=3 level dosage amount is present) is greater than or equal to the j=2 level dosage amount (e.g., $2d_0$) and are identified as associated with the j=2 intermediate layer.

A j=1 intermediate layer includes pixels 1106a, 1106b, 1106c, 1106d and is defined associated with a j=1 level dosage amount (e.g., $d_0$). Pixels 1106a under the dosage curve 1100 between boundaries 1110a corresponds to where the difference between the dosage curve 1100 and the accumulation of the j=3 level dosage amount (e.g., $4d_0$) and j=2 level dosage amount (e.g., $2d_0$) is greater than or equal to the j=1 level dosage amount (e.g., $d_0$) and are identified as associated with the j=1 intermediate layer. Pixels 1106b under the dosage curve 1100 between boundary 1110b and boundary 1110c correspond to where the difference between the dosage curve 1100 and the j=3 level dosage amount (e.g., $4d_0$) (e.g., where no j=2 level dosage amount is present) is greater than or equal to the j=1 level dosage amount (e.g., $d_0$) and are identified as associated with the j=1 intermediate layer. Pixels 1106c under the dosage curve 1100 between boundary 1110d and boundary 1110e correspond to where the difference between the dosage curve 1100 and the j=2 level dosage amount (e.g., $2d_0$) (e.g., where no j=3 level dosage amount is present) is greater than or equal to the j=1 level dosage amount (e.g., $d_0$) and are identified as associated with the j=1 intermediate layer. Pixels 1106d under the dosage curve 1100 between boundary 1110f and boundary 1110g correspond to where the dosage curve 1100 (e.g., where no j=3 level dosage amount or j=2 level dosage amount is present) is greater than or equal to the j=1 level dosage amount (e.g., $d_0$) and are identified as associated with the j=1 intermediate layer.

FIG. 12 illustrates frame layers include frame polygon(s) to continue the foregoing example. The j=3 intermediate layer is rasterized into a j=3 frame layer. Pixels 1102 form a frame polygon 1202 of the j=3 frame layer. Pixels within the frame polygon 1202 are set to be on for the j=3 level dosage amount (e.g., $4d_0$), and pixels outside of the frame polygon 1202 are set to be off for the j=3 level dosage amount. The j=2 intermediate layer is rasterized into a j=2 frame layer. Pixels 1104a form a frame polygon 1204a of the j=2 frame layer, and respective contiguous pixels 1104b form frame polygons 1204b of the j=2 frame layer. Pixels within any of the frame polygons 1204a-b are set to be on for the j=2 level dosage amount (e.g., $2d_0$), and pixels outside of the frame polygons 1204a-b are set to be off. The j=1 intermediate layer is rasterized into a j=1 frame layer. Pixels 1106a form a frame polygon 1206a of the j=1 frame layer; respective contiguous pixels 1106b form frame polygons 1206b of the j=1 frame layer; respective contiguous pixels 1106c form frame polygons 1206c of the j=1 frame layer; and respective contiguous pixels 1106d form frame polygons 1206d of the j=1 frame layer. Pixels within any of the frame polygons 1206a-d are set to be on for the j=1 level dosage amount (e.g., $d_0$), and pixels outside of the frame polygons 1206a-d are set to be off. FIG. 12 shows the frame polygon 1202 of the j=3 frame layer, the frame polygons 1204a-b of the j=2 frame layer, and the frame polygons 1206a-d of the j=1 frame layer, each frame layer being overlaid on the substrate surface 800.

The accumulated dosage amounts are illustrated by the overlaid intermediate layers in FIG. 11. The area between boundaries 1110a receives an accumulated dosage amount of $7d_0$ (e.g., $d_0+2d_0+4d_0$), which is a dosage for forming a full tone feature in the photoresist in this example. The respective areas between boundary 1110a and boundary 1110b receive an accumulated dosage amount of $6d_0$ (e.g., $2d_0+4d_0$). The respective areas between boundary 1110b and boundary 1110c receive an accumulated dosage amount of $5d_0$ (e.g., $d_0+4d_0$). The respective areas between boundary 1110c and boundary 1110d receive an accumulated dosage amount of $4d_0$. The respective areas between boundary 1110d and boundary 1110e receive an accumulated dosage amount of $3d_0$ (e.g., $d_0+2d_0$). The respective areas between boundary 1110*e* and boundary 1110*f* receive an accumulated dosage amount of $2d_0$. The respective areas between boundary 1110*f* and boundary 1110*g* receive an accumulated dosage amount of $d_0$.

In some examples, intermediate layers, each associated with a respective accumulation of dosage amounts, are generated from a dosage curve based on the respective accumulated dosage amount, and the intermediate layers are rasterized to form frame layers including polygons. Each intermediate layer includes pixel(s) that have been identified to be associated with that intermediate layer. The intermediate layers can be generated by comparing the dosage curve with the respective accumulated dosage amount associated with the respective layer. For the respective intermediate layer, pixel(s) are identified to be associated with that intermediate layer when the respective pixel is at a location where the dosage curve is equal to or is greater than the accumulated dosage amount associated with the respective intermediate layer. Each intermediate layer is then rasterized into frame layers, each associated with a respective level of the dosage amounts, using Boolean expressions to identify pixels as being associated with respective frame layers. Contiguous pixels that have been identified as associated with a frame layer form respective frame polygon(s) within the frame layer. Pixel(s) within a frame polygon are set to on for the exposure of the associated dosage amount while other pixels are set to off.

Figure 13:
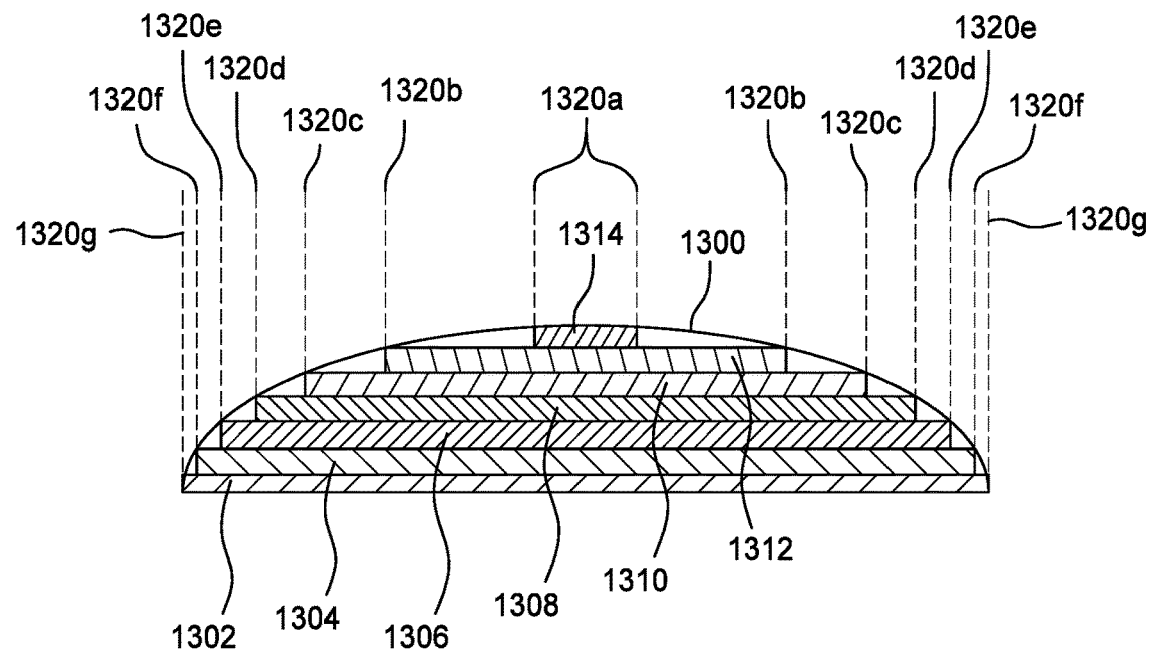
FIG. 13 is a dosage curve cross-section to realize the three-dimensional structure of FIG. 10 and intermediate layers according to some examples.
Figure 14:
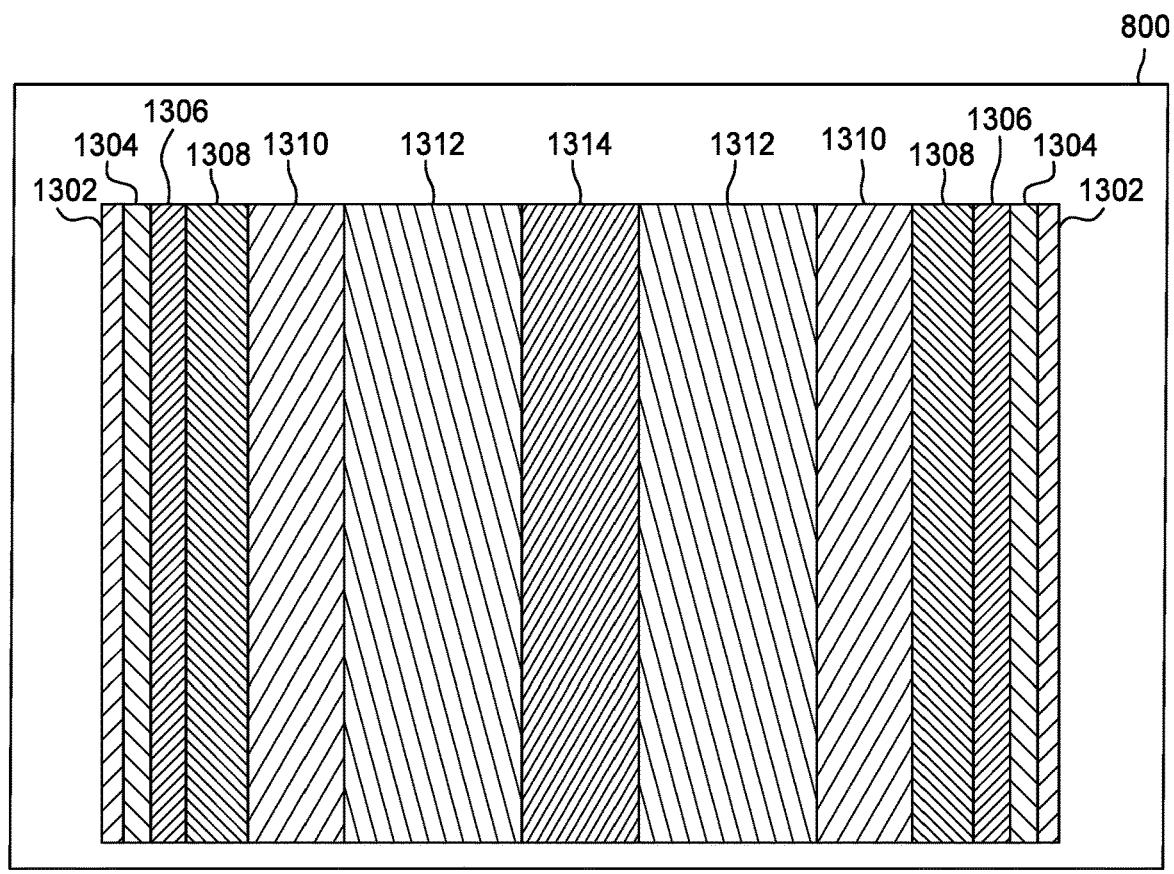
FIG. 14 depicts the intermediate layers of FIG. 13 overlaid on a substrate surface according to some examples.

FIG. 13 illustrates a cross-section of the dosage curve 1300 to realize the three-dimensional structure 1000 and example intermediate layers. FIG. 14 illustrates the intermediate layers overlaid on the substrate surface 800. Like FIG. 11, the cross-section of the dosage curve 1300 of FIG. 13 closely approximates a cross-section of the three-dimensional structure 1000 of FIG. 10, although in practice the dosage curve cross-section can vary from the cross-section of the three-dimensional structure.

In FIG. 13, an a=1 intermediate layer includes pixels 1302 and is defined associated with an a=1 accumulated dosage amount (e.g., $d_0$). Pixels 1302 under the dosage curve 1300 between boundaries 1320*g* correspond to where the dosage curve 1300 is greater than or equal to the a=1 accumulated dosage amount (e.g., $d_0$) and are identified as associated with the a=1 intermediate layer.

An a=2 intermediate layer includes pixels 1304 and is defined associated with an a=2 accumulated dosage amount (e.g., $2d_0$). Pixels 1304 under the dosage curve 1300 between boundaries 1320*f* correspond to where the dosage curve 1300 is greater than or equal to the a=2 accumulated dosage amount (e.g., $2d_0$) and are identified as associated with the a=2 intermediate layer.

An a=3 intermediate layer includes pixels 1306 and is defined associated with an a=3 accumulated dosage amount (e.g., $3d_0$). Pixels 1306 under the dosage curve 1300 between boundaries 1320*e* correspond to where the dosage curve 1300 is greater than or equal to the a=3 accumulated dosage amount (e.g., $3d_0$) and are identified as associated with the a=3 intermediate layer.

An a=4 intermediate layer has pixels 1308 and is defined associated with an a=4 accumulated dosage amount (e.g., $4d_0$). Pixels 1308 under the dosage curve 1300 between boundaries 1320*d* correspond to where the dosage curve 1300 is greater than or equal to the a=4 accumulated dosage amount (e.g., $4d_0$) and are identified as associated with the a=4 intermediate layer.

An a=5 intermediate layer has pixels 1310 and is defined associated with an a=5 accumulated dosage amount (e.g., $5d_0$). Pixels 1310 under the dosage curve 1300 between boundaries 1320*c* correspond to where the dosage curve 1300 is greater than or equal to the a=5 accumulated dosage amount (e.g., $5d_0$) and are identified as associated with the a=5 intermediate layer.

An a=6 intermediate layer includes pixels 1312 and is defined associated with an a=6 accumulated dosage amount (e.g., $6d_0$). Pixels 1312 under the dosage curve 1300 between boundaries 1310*b* correspond to where the dosage curve 1300 is greater than or equal to the a=6 accumulated dosage amount (e.g., $6d_0$) and are identified as associated with the a=6 intermediate layer.

An a=7 intermediate layer has pixels 1314 and is defined associated with an a=7 accumulated dosage amount (e.g., $7d_0$). Pixels 1314 under the dosage curve 1300 between boundaries 1310*a* correspond to where the dosage curve 1300 is greater than or equal to the a=7 accumulated dosage amount (e.g., $7d_0$) and are identified as associated with the a=7 intermediate layer. The intermediate layers having respective pixels 1302-1314 are illustrated in FIG. 14 overlaid on the substrate surface 800.

The a=1 through a=7 intermediate layers are rasterized into frame layers associated with respective dosage amounts using Boolean expressions. To rasterize a j=3 frame layer associated with the j=3 level dosage amount (e.g., $4d_0$), pixels 1308 are identified as being associated with the j=3 frame layer and form a frame polygon 1202 of the j=3 frame layer. Pixels within the frame polygon 1202 are set to be on for the j=3 level dosage amount (e.g., $4d_0$), and pixels outside of the frame polygon 1202 are set to be off for the j=3 level dosage amount. To rasterize a j=2 frame layer associated with the j=2 level dosage amount (e.g., $2d_0$), pixels corresponding to (i) pixels 1312, or (ii) pixels 1304 that do not overlap pixels 1308 are identified as being associated with the j=2 frame layer, and contiguous pixels of these identified pixels form frame polygons 1204*a-b* of the j=2 frame layer. Pixels within the frame polygons 1204*a-b* are set to be on for the j=2 level dosage amount (e.g., $2d_0$), and pixels outside of the frame polygons 1204*a-b* are set to be off for the j=2 level dosage amount. To rasterize a j=1 frame layer associated with the j=1 dosage amount (e.g., $d_0$), pixels corresponding to (i) pixels 1314, (ii) pixels 1310 that do not overlap pixels 1312, (iii) pixels 1306 that do not overlap pixels 1308, or (iv) pixels 1302 that do not overlap pixels 1304 are identified as being associated with the j=1 frame layer, and contiguous pixels of these identified pixels form frame polygons 1206*a-d* of the j=1 frame layer. Pixels within the frame polygons 1206*a-d* are set to be on for the j=1 level dosage amount (e.g., $d_0$), and pixels outside of the frame polygons 1206*a-d* are set to be off for the j=1 level dosage amount. Like stated above, FIG. 12 shows the frame polygon 1202 of the j=3 frame layer, the frame polygons 1204*a-b* of the j=2 frame layer, and the frame polygons 1206*a-d* of the j=1 frame layer, each frame layer being overlaid on the substrate surface 800.

In some examples, the processing step distance, processing address grids, and frame layers generated in block 702 can be or form the recipe. In such examples, the recipe execution application software 622 can include logic or control that interprets the processing step distance, processing address grids, and frame layers to execute the recipe and process a substrate 140 in the system 100. In some examples, the processing step distance, processing address grids, and frame layers can be used by the recipe generation application software 522 to extrapolate, e.g., raw positions of a substrate during processing and which pixels of the image projections systems are turned on to project a dosage amount. Any permutation or combination in the generation and execution of the recipe is contemplated within the scope of various examples.

Referring back to the method 700 of FIGS. 7A and 7B, the exposure recipe is executed at block 704. In block 704 and at block 720, an index j is set equal to the integer n. Then, at block 722, the photoresist on a substrate supported by a stage of a system (e.g., system 100) is exposed to the j-level dosage amount. Pixels of the image projection systems are turned on (and hence, project respective write beams or shots) when a centroid of the respective pixel aligns with an address location of the processing address grid associated with the j-level dosage amount and is within a frame polygon of a frame layer associated with the j-level dosage amount; otherwise, pixels of the image projection system are turned off. After the exposure of block 722, a determination of whether the recipe is complete (e.g., the frame polygons of the frame layers are fully populated) is made at block 724. If the recipe is not complete, at block 726, the stage is moved relative to the image projection systems the processing distance to trigger another exposure. Movement of the stage relative to the image projection systems include the stage moving while the image projection systems remain in a fixed position, moving the image projection systems while the stage remains in a fixed position, or a combination of moving both the stage and the image projection systems. Additionally, movement of the stage relative to the image projection systems can be by continuous movement (e.g., without stopping for an exposure, where each exposure is triggered by movement by a processing step distance from where the previous exposure occurred) and/or by discreet steps (e.g., by pausing at a position for an exposure).

Then, at block 728, a determination is made whether the index j is equal to or less than 1. If not, at block 728, the index j is decreased by one, and the method 700 loops back to block 722 for another exposure. If the index j is equal to or less than 1 at block 728, the method 700 loops back to block 720 to reset the index j to equal n. Accordingly, as illustrated in block 704, the photoresist is iteratively exposed with corresponding movement, where the iterative exposures cycle among the different levels of dosage amounts. The dosage amounts can be realized by changing a dwell time and/or intensity of the exposure relative to other dosage amounts. Block 704 is shown as an example. The operations of the blocks can be performed in different orders. Additionally, the cycling between the different dosage amounts can be in any order.

FIGS. 15 through 17 illustrate an example of executing an exposure recipe in continuance of examples described above where the integer n is equal to three (3). In a first iteration, at block 720, the index j is set to 3. Then, at block 722, the photoresist is exposed to the j=3 level dosage amount (e.g., $4d_0$). FIG. 15 illustrates the processing address grid 902 and the frame polygon 1202 of the j=3 frame layer (each of which is associated with the j=3 level dosage amount) overlaid on the substrate surface 800. Pixels of the image projection systems that each have a centroid that aligns with an address location of the processing address grid 902 and is within the frame polygon 1202 are turned on, and respective shots of the j=3 level dosage amount are directed to the locations of the photoresist corresponding to those pixels. The frame polygons 1202, 1204a-b, 1206a-d are not fully populated, as determined by block 724, and then, at block 726, the stage is moved relative to the image projection systems the processing step distance to trigger another exposure. Since the index j is not less than or equal to one as determined at block 728, the index j is decreased by one to 2.

In a second iteration, with the index j set to 2, at block 722, the photoresist is exposed to the j=2 level dosage amount (e.g., $2d_0$). FIG. 16 illustrates the processing address grid 904 and the frame polygons 1204a-b of the j=2 frame layer (each of which is associated with the j=2 level dosage amount) overlaid on the substrate surface 800. Pixels of the image projection systems that each have a centroid that aligns with an address location of the processing address grid 904 and is within any of the frame polygon 1204a-b are turned on, and respective shots of the j=2 level dosage amount are directed to the locations of the photoresist corresponding to those pixels. The frame polygons 1202, 1204a-b, 1206a-d are not fully populated, as determined by block 724, and then, at block 726, the stage is moved relative to the image projection systems the processing step distance to trigger another exposure. Since the index j is not less than or equal to one as determined at block 728, the index j is decreased by one to 1.

In a third iteration, with the index j set to 1, at block 722, the photoresist is exposed to the j=1 level dosage amount (e.g., $d_0$). FIG. 17 illustrates the processing address grid 906 and the frame polygons 1206a-d of the j=1 frame layer (each of which is associated with the j=1 level dosage amount) overlaid on the substrate surface 800. Pixels of the image projection systems that each have a centroid that aligns with an address location of the processing address grid 906 and is within any of the frame polygon 1206a-d are turned on, and respective shots of the j=1 level dosage amount are directed to the locations of the photoresist corresponding to those pixels. The frame polygons 1202, 1204a-b, 1206a-d are not fully populated, as determined by block 724, and then, at block 726, the stage is moved relative to the image projection systems the processing step distance to trigger another exposure. Since the index j is equal to one as determined at block 728, the index j is reset to 3 at block 720. Subsequent iterations of exposure with movement are then performed, with the exposures cycling through the different levels of dosage amounts, until the frame polygons 1202, 1204a-b, 1206a-d are fully populated, as determined by block 724 to complete the execution of the recipe.

Referring back to the method 700 of FIGS. 7A and 7B, at block 706, the photoresist is developed. Continuing the examples described in the context of FIGS. 8 through 17, the photoresist can be developed into the three-dimensional structure 1000 of FIG. 10.

Various examples can be implemented with any number of levels of dosage amounts. Examples can implement any different quantization of dosage amounts, which may or may not be binary exponential multiples of a nominal dosage amount. Table 1 below shows example combinations of accumulated dosage amounts when the integer n is equal to two (2). Table 2 below shows example combinations of accumulated dosage amounts when the integer n is equal to three (3). Table 3 below shows example combinations of accumulated dosage amounts when the integer is equal to four. In these tables, $d_j$ indicates a j-level dosage amount, and it is assumed, generally, that $d_1 < d_2 < d_3 < d_4$.

TABLE 1

(n = 2)

| Accumulated dosage amount combination number | Dosage Combination |
|---|---|
| 1 | $d_1$ |
| 2 | $d_2$ |
| 3 (full tone) | $d_2 + d_1$ |

TABLE 2

(n = 3)

| Accumulated dosage amount combination number | Dosage Combination |
|---|---|
| 1 | $d_1$ |
| 2 | $d_2$ |
| 3 | $d_2 + d_1$ |
| 4 | $d_3$ |
| 5 | $d_3 + d_1$ |
| 6 | $d_3 + d_2$ |
| 7 (full tone) | $d_3 + d_2 + d_1$ |

TABLE 3

(n = 4)

| Accumulated dosage amount combination number | Dosage Combination |
|---|---|
| 1 | $d_1$ |
| 2 | $d_2$ |
| 3 | $d_2 + d_1$ |
| 4 | $d_3$ |
| 5 | $d_3 + d_1$ |
| 6 | $d_3 + d_2$ |
| 7 | $d_3 + d_2 + d_1$ |
| 8 | $d_4$ |
| 9 | $d_4 + d_1$ |
| 10 | $d_4 + d_2$ |
| 11 | $d_4 + d_2 + d_1$ |
| 12 | $d_4 + d_3$ |
| 13 | $d_4 + d_3 + d_1$ |
| 14 | $d_4 + d_3 + d_2$ |
| 15 (full tone) | $d_4 + d_3 + d_2 + d_1$ |

Figure 18:
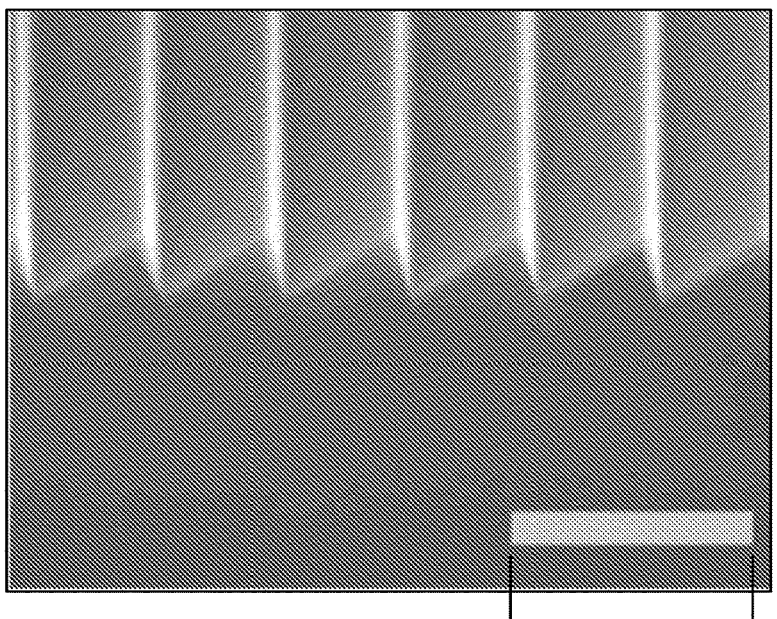
FIG. 18 depicts a photoresist patterned using three levels of dosage amounts according to some examples.

FIG. 18 depicts a photoresist patterned using three levels of dosage amounts according to some examples. The photoresist, in this example, is a three-dimensional blaze grating. As shown, smooth, tapered sidewalls were generated using a single scan process. The single scan process can be implemented with a single substrate loading and a single substrate alignment. Accordingly, processing time can be reduced using a single scan since multiple substrate loading steps, and multiple substrate alignments can be avoided. Additionally, with a single substrate loading and single substrate alignment, overlay errors can be avoided. The exposures can be self-aligned.

While the foregoing is directed to examples of the present disclosure, other and further examples of the disclosure may be devised without departing from the basic scope thereof, and the scope thereof is determined by the claims that follow.

What is claimed is:

1. A system comprising:
a stage configured to support a substrate having a photoresist disposed thereon;
a lithography system support;
a lithography system comprising image projection systems, a controller, and memory, wherein:
the image projection systems are coupled to the lithography system support;
the controller is coupled to the memory, and the memory stores instruction code to be executed by the controller;
execution of the instruction code by the controller causes the controller to control the stage and the image projection systems to:
iteratively expose the photoresist supported by the stage, each of the exposures comprising using one or more write beams projected from the image projection systems, each of the exposures being at a respective one of different dosage amounts, an accumulated dosage amount that is an accumulation of the different dosage amounts being a full tone dosage amount for the photoresist; and
move the stage relative to the image projection systems a step distance between sequential pairs of the exposures, wherein each of the respective one of the different dosage amounts is associated with an address grid, each address grid being offset from each other address grid.

2. The system of claim 1, wherein the different dosage amounts are different binary exponential multiples of a nominal dosage amount.

3. The system of claim 1, wherein:
the image projection systems include an array of pixels; and
for each of the exposures, one or more of the pixels of the array of pixels projects a respective write beam to the photoresist when a centroid of the respective pixel aligns with an address location of an address grid of the address grids within a polygon, each of the address grid and the polygon being associated with the respective one of the different dosage amounts of the respective exposure.

4. The system of claim 3, wherein each address grid associated with any of the different dosage amounts is a hexagonal close-packed (HCP) pattern of address locations.

5. The system of claim 3, wherein different frame layers are associated with respective ones of the different dosage amounts, a frame layer of the frame layers comprising the polygon associated with the respective one of the different dosage amounts of the respective exposure.

6. A non-transitory storage medium storing instructions that, when executed by a processor, cause the processor to perform operations comprising:
generating a nominal address grid to be overlaid on a substrate surface to be processed by a lithography system, the lithography system including image projection systems comprising an array of pixels, each pixel of the array of pixels being configured to selectively direct a write beam towards the substrate surface, generating the nominal address grid being based on a nominal multiplicity and a nominal step distance for forming a full tone feature in a photoresist, generating the nominal address grid further being based on the array of pixels;
generating a processing multiplicity by increasing the nominal multiplicity by a multiple of an integer number;
generating the integer number of processing address grids based on the nominal address grid, each of the processing address grids being associated with a respective one of different dosage amounts, an accumulated dosage amount that is an accumulation of the different dosage amounts being a full tone dosage amount for forming the full tone feature; and generating a recipe for processing by the lithography system based on the processing address grids and the different dosage amounts.

7. The non-transitory storage medium of claim 6, wherein:

the recipe includes instruction code to be executed by a controller; and execution of the instruction code by the controller causes the controller to control a stage and the image projection systems of the lithography system to:

iteratively expose the photoresist supported by the stage, each of the exposures being at a respective one of the different dosage amounts, for each of the exposures, one or more of the pixels of the array of pixels projects a respective write beam to the photoresist when a centroid of the respective pixel aligns with an address location of the processing address grid associated with the respective one of the different dosage amounts of the respective exposure and when the address location is within a polygon associated with the respective one of the different dosage amounts of the respective exposure; and move the stage relative to the image projection systems a processing step distance after each of the exposures before a next one of the exposures.

8. The non-transitory storage medium of claim 7, wherein the processing step distance is a quotient of the nominal step distance divided by the integer number.

9. The non-transitory storage medium of claim 6, wherein the different dosage amounts are different binary exponential multiples of a nominal dosage amount.

10. The non-transitory storage medium of claim 6, wherein each of the processing address grids is a hexagonal close-packed (HCP) pattern of address locations.

11. The non-transitory storage medium of claim 6, wherein the operations further comprise:

obtaining a representation of a three-dimensional structure to be patterned in the photoresist; and decomposing the representation of the three-dimensional structure into polygons in respective layers, each of the layers being associated with a respective one of the different dosage amounts, the recipe further being based on the polygons of the layers.

12. A method comprising:

executing a recipe by a lithography system, executing the recipe comprising, in a single scan:

iteratively exposing a photoresist supported by a stage of the lithography system using image projection systems of the lithography system, the image projection systems comprising an array of pixels, each pixel of the array of pixels being configured to selectively direct a write beam towards the photoresist, each of the exposures being at a dosage amount different from an immediately preceding one of the exposures, for each of the exposures, one or more pixels of the array of pixels projects a respective write beam to the photoresist when a centroid of the respective pixel aligns with an address location of a processing address grid associated with the respective dosage amount of the respective exposure and when the address location is within a polygon associated with the respective dosage amount of the respective exposure, an accumulation of the dosage amounts being a full tone dosage amount for forming a full tone feature in the photoresist; and moving the stage relative to the image projection systems a processing step distance after the exposure and before a subsequent exposure.

13. The method of claim 12 further comprising:

generating a nominal address grid to be overlaid on the photoresist, generating the nominal address grid being based on a nominal multiplicity and a nominal step distance for forming the full tone feature in the photoresist, generating the nominal address grid further being based on the array of pixels;

generating a processing multiplicity by increasing the nominal multiplicity by a multiple of an integer number, the processing step distance being a quotient of the nominal step distance divided by the integer number;

generating the integer number of processing address grids based on the nominal address grid, each of the processing address grids being associated with a respective one of the dosage amounts; and generating the recipe based on the processing address grids and the dosage amounts.

14. The method of claim 13 further comprising:

obtaining a representation of a three-dimensional structure to be patterned in the photoresist; and decomposing the representation of the three-dimensional structure into polygons in respective frame layers, each of the frame layers being associated with a respective one of the dosage amounts, the recipe further being based on the polygons of the frame layers.

15. The method of claim 14, wherein decomposing the representation of the three-dimensional structure comprises:

obtaining a dosage curve corresponding to the three-dimensional structure;

beginning with a highest dosage amount and continuing iteratively for each next highest dosage amount, identifying pixels of a respective intermediate layer associated with the dosage amount of the respective iteration, the identified pixels corresponding to respective locations where a difference between the dosage curve and an accumulated dosage amount of previous iterations at the respective locations is equal to or greater than the dosage amount of the respective iteration; and rasterizing the intermediate layers into the frame layers.

16. The method of claim 14, wherein decomposing the representation of the three-dimensional structure comprises:

obtaining a dosage curve corresponding to the three-dimensional structure;

for each of intermediate layers, identifying pixels of the respective intermediate layer corresponding to respective locations where the dosage curve is equal to or greater than an accumulated dosage amount associated with the respective intermediate layer; and rasterizing the intermediate layers into the frame layers, each of the frame layers being associated with a respective one of the dosage amounts.

17. The method of claim 12, wherein each processing address grid associated with a respective dosage amount is a hexagonal close-packed (HCP) pattern of address locations.

18. The method of claim 12, wherein the dosage amounts are different binary exponential multiples of a nominal dosage amount.

19. The method of claim 12, wherein each processing address grid associated with a respective dosage amount is offset from each other processing address grid associated with each other dosage amount.

* * * * *